(12) United States Patent
Arima et al.

(10) Patent No.: US 11,469,334 B2
(45) Date of Patent: Oct. 11, 2022

(54) SCHOTTKY BARRIER DIODE

(71) Applicants: TDK Corporation, Tokyo (JP); TAMURA CORPORATION, Tokyo (JP); Novel Crystal Technology, Inc., Saitama (JP)

(72) Inventors: Jun Arima, Tokyo (JP); Minoru Fujita, Tokyo (JP); Jun Hirabayashi, Tokyo (JP); Kohei Sasaki, Saitama (JP)

(73) Assignees: TDK CORPORATION, Tokyo (JP); TAMURA CORPORATION, Tokyo (JP); NOVEL CRYSTAL TECHNOLOGY, INC., Saitama (JP)

( * ) Notice: Subject to any disclaimer, the term of this patent is extended or adjusted under 35 U.S.C. 154(b) by 0 days.

(21) Appl. No.: 17/041,127

(22) PCT Filed: Mar. 11, 2019

(86) PCT No.: PCT/JP2019/009676
§ 371 (c)(1),
(2) Date: Sep. 24, 2020

(87) PCT Pub. No.: WO2019/188188
PCT Pub. Date: Oct. 3, 2019

(65) Prior Publication Data
US 2021/0119062 A1 Apr. 22, 2021

(30) Foreign Application Priority Data

Mar. 30, 2018 (JP) .............................. JP2018-067392

(51) Int. Cl.
*H01L 29/872* (2006.01)
*H01L 29/06* (2006.01)
(Continued)

(52) U.S. Cl.
CPC ............ *H01L 29/872* (2013.01); *H01L 29/06* (2013.01); *H01L 29/24* (2013.01); *H01L 29/41* (2013.01);
(Continued)

(58) Field of Classification Search
None
See application file for complete search history.

(56) References Cited

U.S. PATENT DOCUMENTS

| 2005/0139947 A1 | 6/2005 | Okada et al. |
| 2011/0101369 A1 | 5/2011 | Zhu |
| 2012/0217541 A1 | 8/2012 | Hsieh |

(Continued)

FOREIGN PATENT DOCUMENTS

| CN | 106887470 A | 6/2017 |
| EP | 1 339 105 A2 | 8/2003 |

(Continued)

OTHER PUBLICATIONS

International Search Report issued in corresponding International Patent Application No. PCT/JP2019/009676, dated May 7, 2019, with English translation.

(Continued)

*Primary Examiner* — Xiaoming Liu
(74) *Attorney, Agent, or Firm* — McDermott Will & Emery LLP

(57) ABSTRACT

An object of the present invention is to provide a Schottky barrier diode less apt to cause dielectric breakdown due to concentration of an electric field. A Schottky barrier diode includes a semiconductor substrate 20 made of gallium oxide, a drift layer 30 made of gallium oxide and provided on the semiconductor substrate 20, an anode electrode 40 brought into Schottky contact with the drift layer 30, and a cathode electrode 50 brought into ohmic contact with the semiconductor substrate 20. The drift layer 30 has an outer peripheral trench 10 that surrounds the anode electrode 40 in a plan view, and the outer peripheral trench 10 is filled with a semiconductor material 11 having a conductivity type opposite to that of the drift layer 30. An electric field is dispersed by the presence of the thus configured outer peripheral trench 10. This alleviates electric field concentration on the corner of the anode electrode 40, making it less apt to cause dielectric breakdown.

14 Claims, 13 Drawing Sheets

(51) Int. Cl.
  *H01L 29/41* (2006.01)
  *H01L 29/47* (2006.01)
  *H01L 29/24* (2006.01)
  *H01L 29/66* (2006.01)

(52) U.S. Cl.
  CPC ........ *H01L 29/47* (2013.01); *H01L 29/66143* (2013.01)

(56) References Cited

U.S. PATENT DOCUMENTS

| | | | | |
|---|---|---|---|---|
| 2015/0333133 | A1* | 11/2015 | Boettcher | H01L 29/063 257/488 |
| 2016/0254357 | A1 | 9/2016 | Aketa | |
| 2017/0200790 | A1 | 7/2017 | Hitora et al. | |
| 2019/0148563 | A1 | 5/2019 | Sasaki et al. | |
| 2020/0185541 | A1* | 6/2020 | Yuda | H01L 29/7838 |

FOREIGN PATENT DOCUMENTS

| | | |
|---|---|---|
| JP | 2017-045969 A | 3/2017 |
| JP | 2017-199869 A | 11/2017 |
| WO | 2015/060441 A1 | 4/2015 |
| WO | 2016/075927 A1 | 5/2016 |

OTHER PUBLICATIONS

K. Sasaki et al., "First Demonstration of Ga2O3 Trench MOS-Type Schottky Barrier Diodes", IEEE Electron Device Letters, IEEE, vol. 38, No. 6, Jun. 1, 2017, pp. 783-785.

Extended European Search Report issued in corresponding European Patent Application No. 19775799.0-1212, dated Nov. 19, 2021.

\* cited by examiner

SCHOTTKY BARRIER DIODE

CROSS REFERENCE TO RELATED APPLICATIONS

This application is the U.S. National Phase under 35 U.S.C. § 371 of International Application No. PCT/JP2019/009676, filed on Mar. 11, 2019, which claims the benefit of Japanese Application No. 2018-067392, filed on Mar. 30, 2018, the entire contents of each are hereby incorporated by reference.

TECHNICAL FIELD

The present invention relates to a Schottky barrier diode and, more particularly, to a Schottky barrier diode using gallium oxide.

BACKGROUND ART

A Schottky barrier diode is a rectifying element utilizing a Schottky barrier generated due to bonding between metal and a semiconductor and is lower in forward voltage and higher in switching speed than a normal diode having a PN junction. Thus, the Schottky barrier diode is sometimes utilized as a switching element for a power device.

When the Schottky barrier diode is utilized as a switching element for a power device, it is necessary to ensure a sufficient backward withstand voltage, so that, silicon carbide (SiC), gallium nitride (GaN), or gallium oxide ($Ga_2O_3$) having a larger band gap is sometimes used in place of silicon (Si). Among them, gallium oxide has a very large band gap (4.8 eV to 4.9 eV) and a large breakdown field (7 MV/cm to 8 MV/cm), so that a Schottky barrier diode using gallium oxide is very promising as the switching element for a power device. An example of the Schottky barrier diode using gallium oxide is described in Patent Documents 1 and 2.

In the Schottky barrier diode described in Patent Document 2, a plurality of trenches are formed so as to overlap an anode electrode in a plan view, and the inner wall of each of the trenches is covered with an insulating film. With this structure, when a backward voltage is applied, a mesa region positioned between adjacent trenches becomes a depletion layer, so that a channel region of a drift layer is pinched off. Thus, a leak current upon application of the backward voltage can be significantly reduced.

CITATION LIST

Patent Document

[Patent Document 1] JP 2017-045969A
[Patent Document 2] JP 2017-199869A

SUMMARY OF INVENTION

Problem to be Solved by the Invention

However, in the Schottky barrier diodes described in Patent Documents 1 and 2, an electric field concentrates on the end portion of the anode electrode, so that when a high voltage is applied, dielectric breakdown occurs in this portion. For example, in the Schottky barrier diodes described in Patent Document 2, an electric field concentrates on an edge part of the trench positioned at the end portion.

It is therefore an object of the present embodiment to provide a Schottky barrier diode using gallium oxide, which is less apt to cause dielectric breakdown due to concentration of an electric field.

Means for Solving the Problem

A Schottky barrier diode according to the present invention includes: a semiconductor substrate made of gallium oxide; a drift layer made of gallium oxide and provided on the semiconductor substrate; an anode electrode brought into Schottky contact with the drift layer; and a cathode electrode brought into ohmic contact with the semiconductor substrate. The drift layer has an outer peripheral trench that surrounds the anode electrode in a plan view, and the outer peripheral trench is filled with a semiconductor material having a conductivity type opposite to that of the drift layer.

According to the present invention, an electric field is dispersed by the presence of the outer peripheral trench formed in the drift layer. In addition, the outer peripheral trench is filled with a semiconductor material having a conductivity type opposite to that of the drift layer, so that a depletion layer extends around the outer peripheral trench due to a difference in potential between the semiconductor material in the outer peripheral trench and the drift layer. This alleviates concentration of the electric field on the corner of the anode electrode, making it less apt to cause dielectric breakdown.

In the present invention, the drift layer may further have a plurality of center trenches formed at a position overlapping the anode electrode in a plan view. In this case, the inner wall of each of the plurality of center trenches may be covered with an insulating film. With this configuration, a mesa region positioned between the adjacent center trenches becomes a depletion layer upon application of a backward voltage, so that a channel region of the drift layer is pinched off. Thus, a leak current upon application of the backward voltage can be significantly reduced.

The Schottky barrier diode according to the present invention may further include an insulating layer formed on the drift layer and having an opening through which a part of the drift layer is exposed, and the anode electrode may be formed so as to be brought into Schottky contact with the drift layer through the opening and located on the insulating layer positioned at the periphery of the opening. With this configuration, a so-called field plate structure can be obtained, allowing further alleviation of an electric field to be applied to the bottom portion of the center trench positioned at the end portion.

In the present invention, the width of the outer peripheral trench may be larger than the width of the center trench, the depth of the outer peripheral trench may be larger than the depth of the center trench, and the mesa width between the outer peripheral trench and center trench positioned closest to the outer peripheral trench may be smaller than the mesa width between the plurality of center trenches. With this configuration, concentration of an electric field is further alleviated, making it far less likely to cause dielectric breakdown.

Advantageous Effects of the Invention

As described above, according to the present invention, there can be provided a Schottky barrier diode using gallium oxide, which is less apt to cause dielectric breakdown due to concentration of an electric field.

MODE FOR CARRYING OUT THE INVENTION

Preferred embodiments of the present invention will be explained below in detail with reference to the accompanying drawings.

First Embodiment

Figure 1:
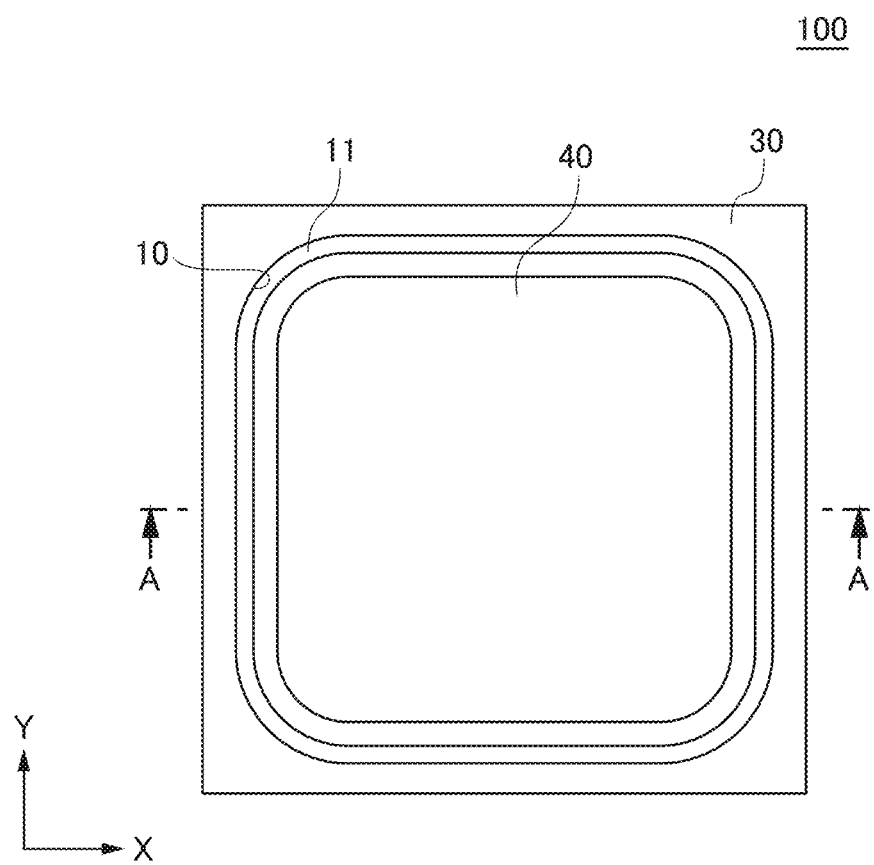
FIG. 1 is a schematic top view illustrating the configuration of a Schottky barrier diode 100 according to a first embodiment of the present invention.
Figure 2:
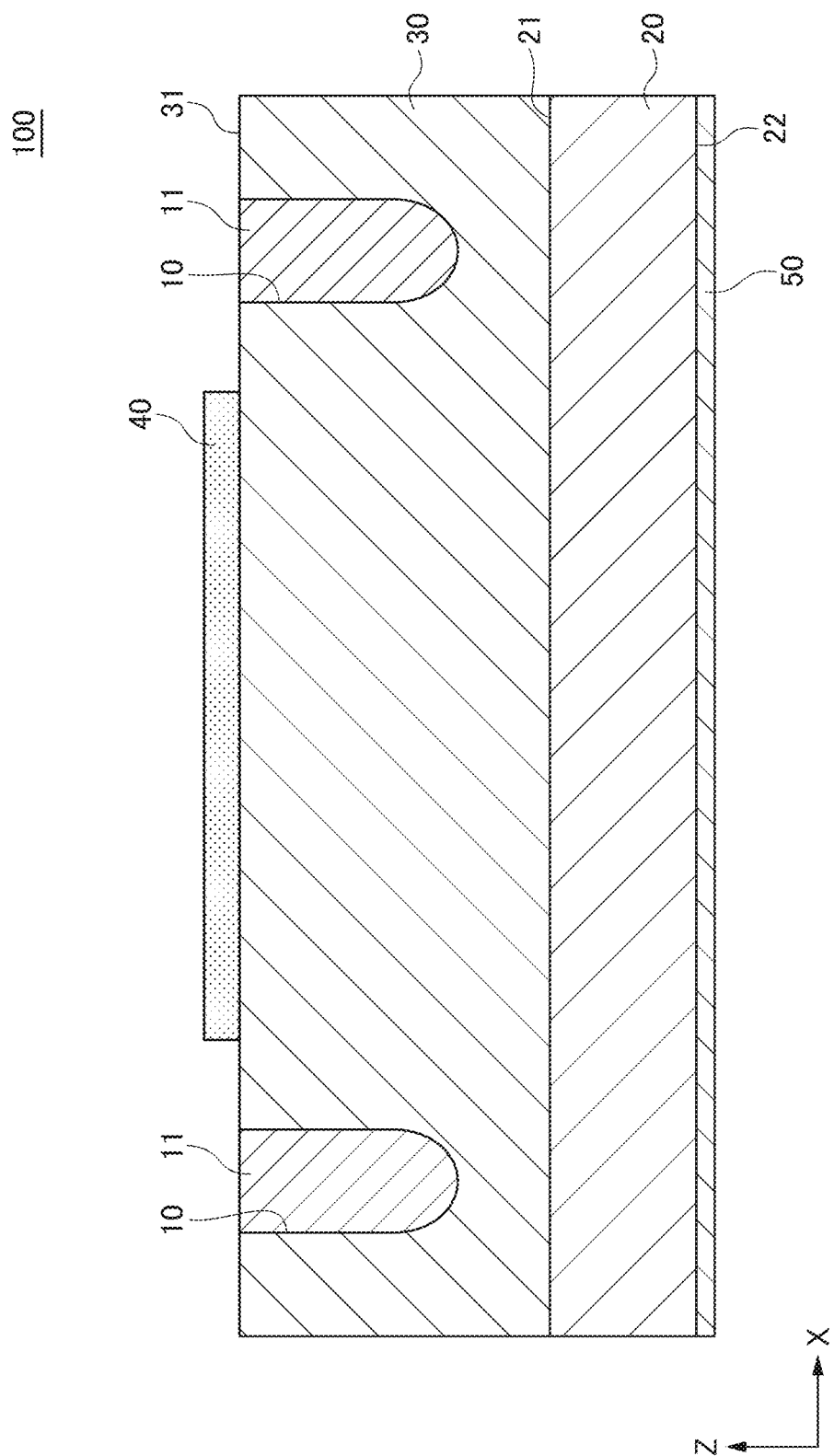
FIG. 2 is a cross-sectional view taken along line A-A in FIG. 1.

FIG. 1 is a schematic top view illustrating the configuration of a Schottky barrier diode 100 according to a first embodiment of the present invention. FIG. 2 is a cross-sectional view taken along line A-A in FIG. 1.

As illustrated in FIGS. 1 and 2, the Schottky barrier diode 100 according to the present embodiment has a semiconductor substrate 20 and a drift layer 30, both of which are made of gallium oxide ($\beta$-$Ga_2O_3$). The semiconductor substrate 20 and the drift layer 30 are each introduced with silicon (Si) or tin (Sn) as an n-type dopant. The concentration of the dopant is higher in the semiconductor substrate 20 than in the drift layer 30, whereby the semiconductor substrate 20 and the drift layer 30 function as an $n^+$ layer and an $n^-$ layer, respectively.

The semiconductor substrate 20 is obtained by cutting a bulk crystal formed using a melt-growing method, and the thickness (height in the Z-direction) thereof is about 250 µm. Although there is no particular restriction on the planar size of the semiconductor substrate 20, the planar size is generally selected in accordance with the amount of current flowing in the element and, when the maximum amount of forward current is about 20 A, the widths in the X- and Y-directions may be set to about 2.4 mm.

The semiconductor substrate 20 in a mounted state has an upper surface 21 positioned on its upper surface side and a back surface 22 positioned on its lower surface side (opposite to the upper surface side 21). The drift layer 30 is formed on the entire upper surface 21. The drift layer 30 is a thin film obtained by epitaxially growing gallium oxide on the upper surface 21 of the semiconductor substrate 20 using a reactive sputtering method, a PLD method, an MBE method, an MOCVD method, or an HVPE method. Although there is no particular restriction on the film thickness of the drift layer 30, the film thickness is generally selected in accordance with the backward withstand voltage of the element and, in order to ensure a withstand voltage of about 600 V, the film thickness may be set to, e.g., about 7 µm.

An anode electrode 40, which is brought into Schottky contact with the drift layer 30, is formed on an upper surface 31 of the drift layer 30. The anode electrode 40 is formed of metal such as platinum (Pt), palladium (Pd), gold (Au), nickel (Ni), or the like. The anode electrode 40 may have a multi layer structure of different metal films, such as Pt/Au, Pt/Al, Pd/Au, Pd/Al, Pt/Ti/Au, or Pd/Ti/Au. On the other hand, a cathode electrode 50, which is brought into ohmic contact with the semiconductor substrate 20, is formed on the back surface 22 of the semiconductor substrate 20. The cathode electrode 50 is formed of metal such as titanium (Ti). The cathode electrode 50 may have a multilayer structure of different metal films, such as Ti/Au or Ti/Al.

The drift layer 30 has formed therein an outer peripheral trench 10 at a position not overlapping the anode electrode 40 in a plan view (as viewed in the Z-direction) so as to surround the anode electrode 40. The outer peripheral trench 10 can be formed by etching the drift layer 30 from the upper surface 31 side.

The outer peripheral trench 10 is filled with a semiconductor material 11 having a conductivity type opposite to that of the drift layer 30. In the present embodiment, the drift layer 30 is n-type, and thus the semiconductor material 11 filled in the outer peripheral trench 10 is p-type. Examples of the p-type semiconductor include Si, GaAs, SiC, Ge, ZnSe, CdS, InP, SiGe, and a p-type oxide semiconductor such as NiO, $Cu_2O$, or $Ag_2O$. The p-type oxide semiconductor has an advantage of being free from oxidation. In particular, NiO is a special material showing only p-type conductivity and is most preferable in terms of quality stabilization. Further, NiO has a band gap as large as 3.7 eV and is thus desirable as a material taking advantage of high withstand voltage of gallium oxide. Further, to control acceptor concentration, Li or La may be added as a dopant in a ratio of about 0.2 mol % to 1.0 mol % to NiO (99.9%). The acceptor concentration is preferably equal to or higher than $5 \times 10^{17}$ $cm^{-3}$ and more preferably equal to or higher than $5 \times 10^{18}$ $cm^{-3}$ in terms of production stability. This is because a low acceptor concentration may cause depletion of the outer peripheral trench 10, which may fail to provide a desired function. Thus, a higher acceptor concentration is more preferable. However, when the acceptor concentration exceeds $1 \times 10^{22}$ cm$^{-3}$, film characteristics may deteriorate, so that the acceptor concentration is preferably equal to or lower than about $5 \times 10^{21}$ cm$^{-3}$. The semiconductor material 11 filled in the outer peripheral trench 10 may be in a floating state.

When the p-type oxide constituting the semiconductor material 11 is in a fully amorphous state, it is unintentionally crystallized in a heating process during device production, which may make the characteristics thereof unstable. Considering this, at the time when the p-type oxide is filled in the outer peripheral trench 10, about 50% by volume thereof is crystallized, for example. This can reduce the influence of crystallization in a heat process during device production.

The outer peripheral trench 10 is formed for alleviating an electric field concentrating on the end portion of the anode electrode 40. In the present embodiment, the inside of the outer peripheral trench 10 is filled with the semiconductor material 11, so that a depletion layer extends around the outer peripheral trench 10 due to a difference in potential between the semiconductor material 11 and the drift layer 30.

As described above, in the Schottky barrier diode 100 according to the present embodiment, the outer peripheral trench 10 is formed in the drift layer 30, and the inside of the outer peripheral trench 10 is filled with the semiconductor material 11 having a conductivity type opposite to that of the drift layer 30, so that an electric field concentrating on the end portion of the anode electrode 40 is alleviated by the outer peripheral trench 10 and the depletion layer extending around the outer peripheral trench 10. This can prevent dielectric breakdown due to concentration of an electric field.

Second Embodiment

Figure 3:
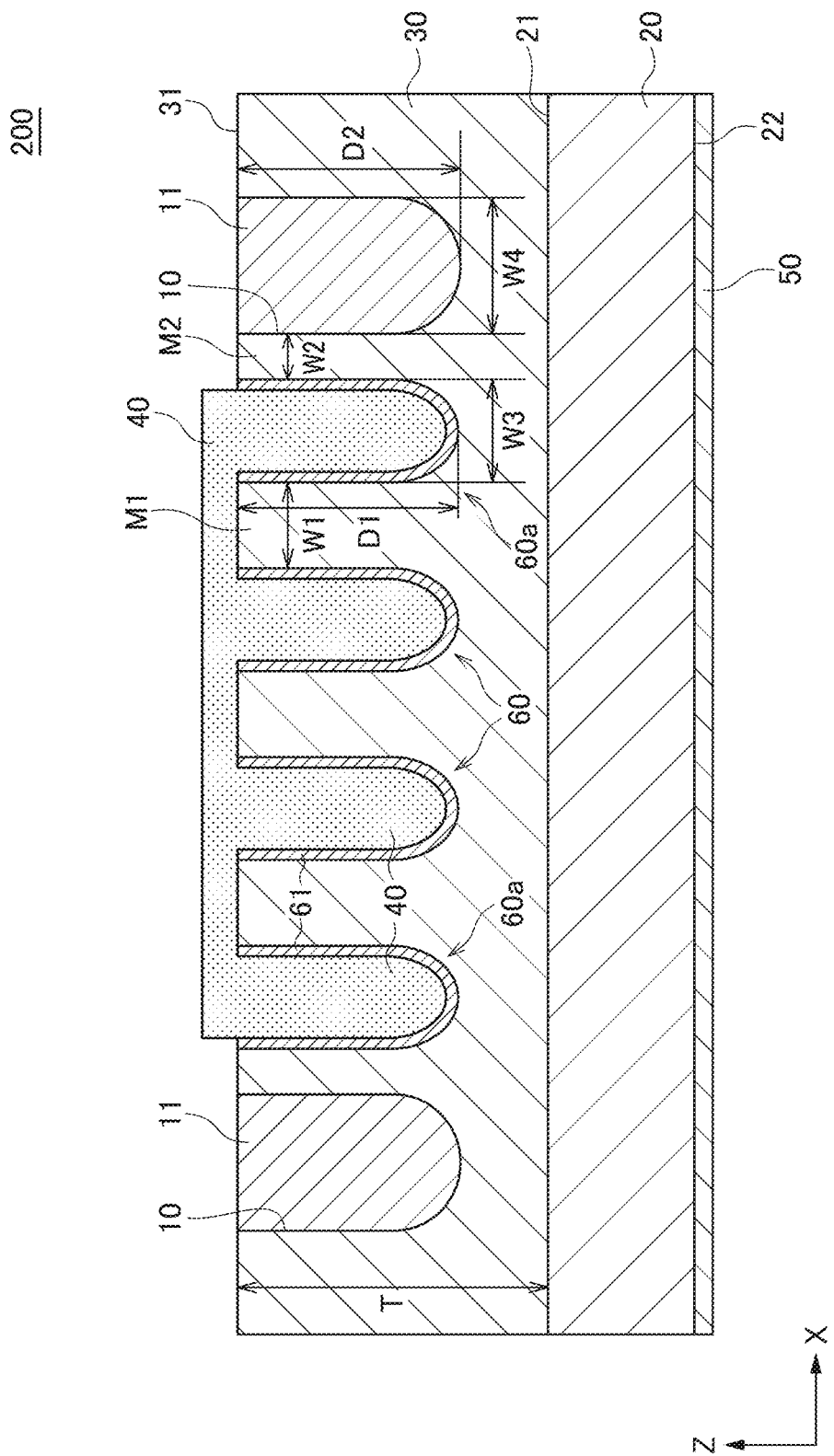
FIG. 3 is a schematic cross-sectional view illustrating the configuration of a Schottky barrier diode 200 according to a second embodiment of the present invention.

FIG. 3 is a schematic cross-sectional view illustrating the configuration of a Schottky barrier diode 200 according to a second embodiment of the present invention.

As illustrated in FIG. 3, in the Schottky barrier diode 200 according to the second embodiment, a plurality of center trenches 60 are formed in the drift layer 30. The center trenches 60 are all formed at a position overlapping the anode electrode 40 in a plan view. The inner wall of each of the center trenches 60 is covered with an insulating film 61 made of HfO$_2$ or the like. The inside of each center trench 60 is filled with a conductive material. The conductive material filled in the center trenches 60 may be the same material as the anode electrode 40, or may be highly doped polycrystalline Si or a metal material such as Ni or Au. In the present embodiment, the plurality of center trenches 60 are formed in the drift layer 30, so that the anode electrode 40 may be made of a material having a low working function, such as molybdenum (Mo) or copper (Cu). Further, in the present embodiment, the dopant concentration of the drift layer 30 is increased up to about $5 \times 10^{16}$ cm$^{-3}$. Other configurations are basically the same as those of the Schottky barrier diode 100 according to the first embodiment, so the same reference numerals are given to the same elements, and overlapping description will be omitted.

A part of the drift layer 30 that is positioned between the adjacent center trenches 60 constitutes a mesa region M1. The mesa region M1 becomes a depletion layer when a backward voltage is applied between the anode electrode 40 and the cathode electrode 50, so that a channel region of the drift layer 30 is pinched off. Thus, a leak current upon application of the backward voltage can be significantly reduced.

In the Schottky barrier diode having such a structure, an electric field concentrates on the bottom portion of a center trench 60a positioned at the end portion, making it more likely to cause dielectric breakdown at this portion. However, in the Schottky barrier diode 200 according to the present embodiment, the outer peripheral trench 10 is formed at the outer periphery of the center trenches 60 so as to surround the center trenches 60, so that an electric field concentrating on the center trench 60a at the end portion is alleviated. In addition, the inside of the outer peripheral trench 10 is filled with the semiconductor material 11 having a conductivity type opposite to that of the drift layer 30, an electric field concentrating on the center trench 60a at the end portion is alleviated more effectively.

As illustrated in FIG. 3, a part of the drift layer 30 that is positioned between the center trench 60a at the end portion and the outer peripheral trench 10 constitutes a mesa region M2. Although there is no particular restriction on the relationship between a mesa width W1 of the mesa region M1 and a mesa width W2 of the mesa region M2, W1≥W2 is preferably satisfied, and
W1>W2 is more preferably satisfied.

This is because the mesa width W1 of the mesa region M1 needs to be set large to some extent in order to reduce ON resistance and that the smaller the mesa width W2 of the mesa region M2 is, the higher the electric field dispersion effect becomes. However, the lower limit of the mesa width W2 of the mesa region M2 is restricted by processing accuracy.

Although there is also no particular restriction on the relationship between a width W3 of the center trench 60 and a width W4 of the outer peripheral trench 10, W3≤W4 is preferably satisfied, and
W3<W4 is more preferably satisfied.

This is because the width W3 of the center trench 60 needs to be reduced to some extent in order to reduce ON resistance and that the larger the width W4 of the outer peripheral trench 10 is, the higher the electric field dispersion effect becomes.

As described above, the Schottky barrier diode 200 according to the present embodiment has an effect that can reduce a leak current upon application of a backward voltage, in addition to the effect obtained by the Schottky barrier diode 100 according to the first embodiment. Further, in the present embodiment, the outer peripheral trench 10 and the center trench 60 have the same depth (D2=D1), and thus, they can be formed in the same process.

However, in the present invention, the depth D2 of the outer peripheral trench 10 and the depth D1 of the center trench 60 may not necessarily be the same. Thus, the depth D2 of the outer peripheral trench 10 may be smaller than the depth D1 of the center trench 60 like a Schottky barrier diode 200A according to a first modification (FIG. 4), or the depth D2 of the outer peripheral trench 10 may be larger than the depth D1 of the center trench 60 like a Schottky barrier diode 200B according to a second modification (FIG. 5). The larger the depth D2 of the outer peripheral trench 10 is, the larger the effect of alleviating an electric field concentrating on the center trench 60a at the end portion becomes. However, when the depth D2 of the outer peripheral trench 10 is excessively large, the residual film thickness of the drift layer 30 becomes excessively small, making it more likely to cause breakdown at this portion. Considering this, a difference (T−D2) between a film thickness T of the drift layer 30 and the depth D2 of the outer peripheral trench 10 is preferably equal to or more than 2 μm.

Figure 6:
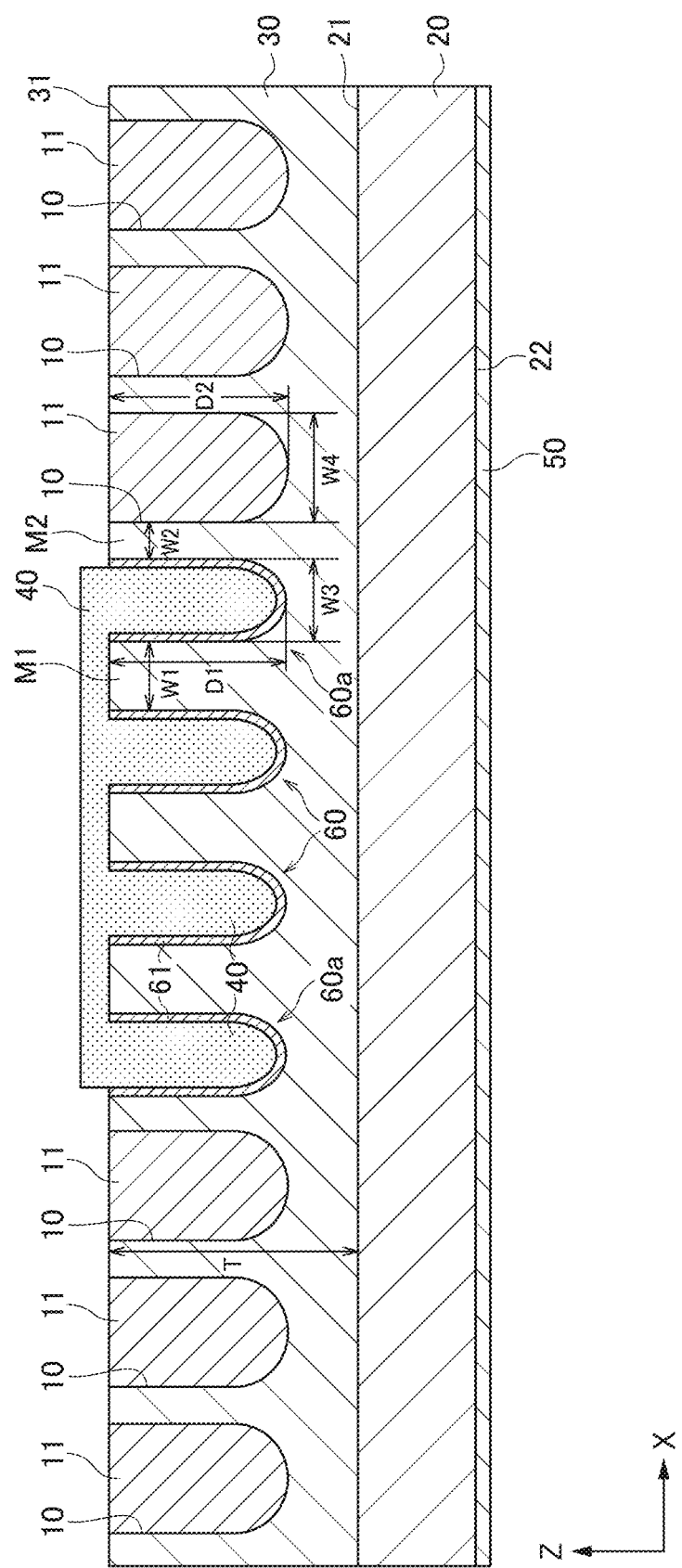
FIG. 6 is a schematic cross-sectional view illustrating the configuration of a Schottky barrier diode 200C according to a third modification of the second embodiment of the present invention.

There is also no particular restriction on the number of the outer peripheral trenches 10, and a plurality of outer peripheral trenches 10 may be formed like a Schottky barrier diode 200C according to a third modification (FIG. 6). In such a case, an electric field concentrates on the outermost outer peripheral trench 10. Further, an electric field concentrating on the center trench 60a at the end portion is more effectively alleviated as the number of the outer peripheral trenches 10 increases.

While the inner wall of the center trench 60 is covered with the insulating film 61, and the inside thereof is filled with the same material as the anode electrode 40 in the present embodiment, the inside of the center trench 60 may be filled with a semiconductor material having an opposite conductivity type (p-type, in the present embodiment) without the use of the insulating film 61.

Third Embodiment

Figure 7:
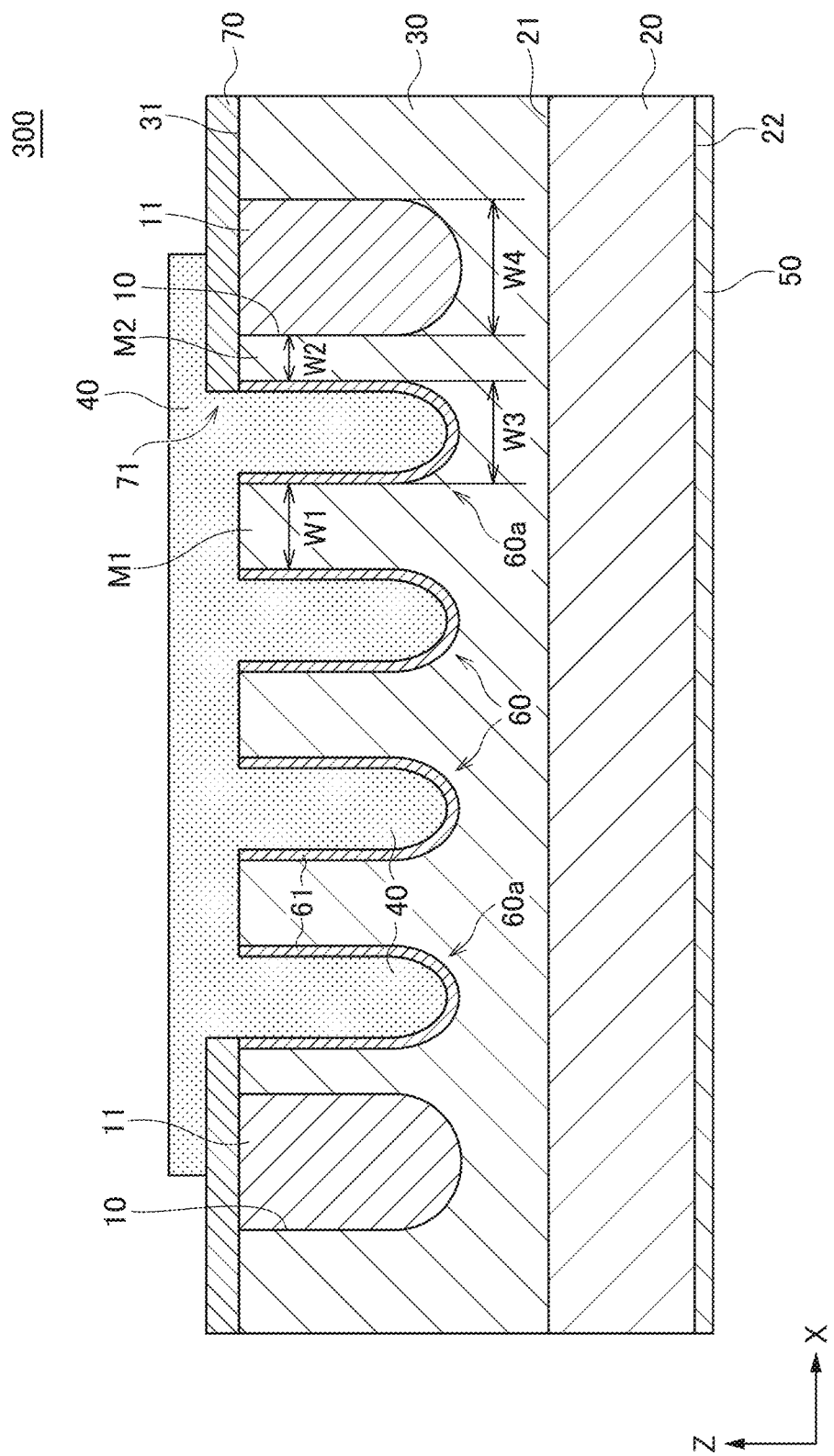
FIG. 7 is a schematic cross-sectional view illustrating the configuration of a Schottky barrier diode 300 according to a third embodiment of the present invention.

FIG. 7 is a schematic cross-sectional view illustrating the configuration of a Schottky barrier diode 300 according to a third embodiment of the present invention.

As illustrated in FIG. 7, the Schottky barrier diode 300 according to the third embodiment differs from the Schottky barrier diode 200 according to the second embodiment in that an insulating layer 70 is formed on the drift layer 30. Other configurations are basically the same as those of the Schottky barrier diode 200 according to the second embodiment, so the same reference numerals are given to the same elements, and overlapping description will be omitted.

The insulating layer 70, which is made of an insulating material such as silicon oxide, is formed so as to cover the upper surface 31 of the drift layer 30 and has an opening 71 through which the center trenches 60 are exposed. A part of the anode electrode 40 is formed on the insulating layer 70 and the remaining part thereof is brought into Schottky contact with the drift layer 30 through the opening 71. As a result, a so-called field plate structure can be obtained, allowing further alleviation of an electric field to be applied to the bottom portion of the trench 60a positioned at the end portion.

While the preferred embodiments of the present invention have been described, the present invention is not limited to the above embodiments, and various modifications may be made within the scope of the present invention, and all such modifications are included in the present invention.

Example 1

A simulation model of Example 1 having the same configuration as that of the Schottky barrier diode 100 illustrated in FIGS. 1 and 2 was assumed, and electric field strength was simulated with a backward voltage applied between the anode electrode 40 and the cathode electrode 50. The dopant concentration of the semiconductor substrate 20 was set to $1 \times 10^{18}$ cm$^{-3}$, and the dopant concentration of the drift layer 30 was to $1 \times 10^{16}$ cm$^{-3}$. The thickness of the drift layer 30 was set to 7 μm. The semiconductor material 11 filled in the outer peripheral trench 10 was NiO having an acceptor concentration of $1 \times 10^{19}$ cm$^{-3}$. For comparison, a simulation model of Comparative Example 1 having a structure obtained by removing the outer peripheral trench 10 and semiconductor material 11 from the simulation model of Example 1 was assumed, and electric field strength was simulated with a backward voltage applied between the anode electrode 40 and the cathode electrode 50.

Figure 8:
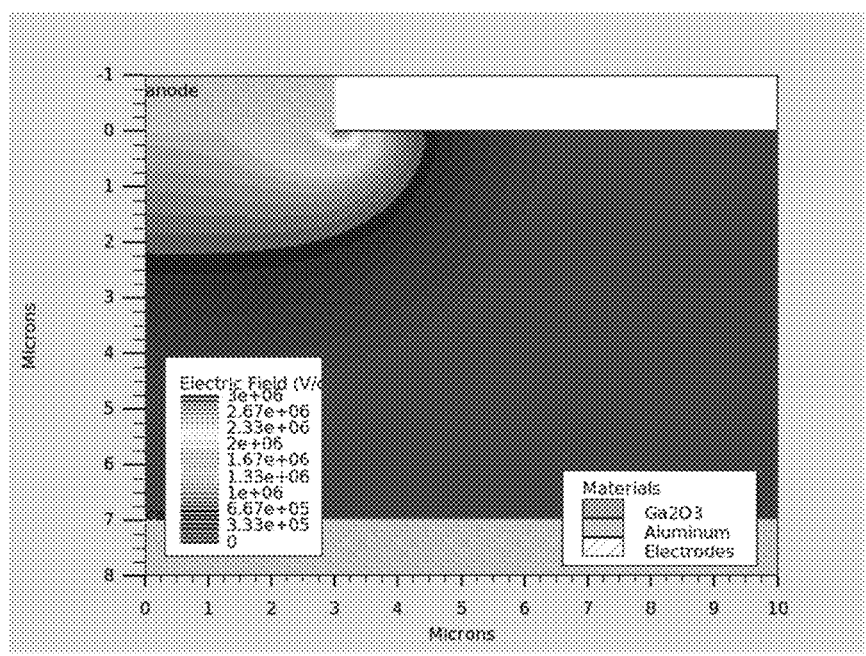
FIG. 8 is a view illustrating the simulation result of Comparative Example 1.

FIG. 8 is a view illustrating the simulation result of Comparative Example 1. In the simulation model of Comparative Example 1, an electric field concentrated on the corner of the anode electrode 40, and the maximum value thereof was 2.8 MV/cm.

Figure 9:
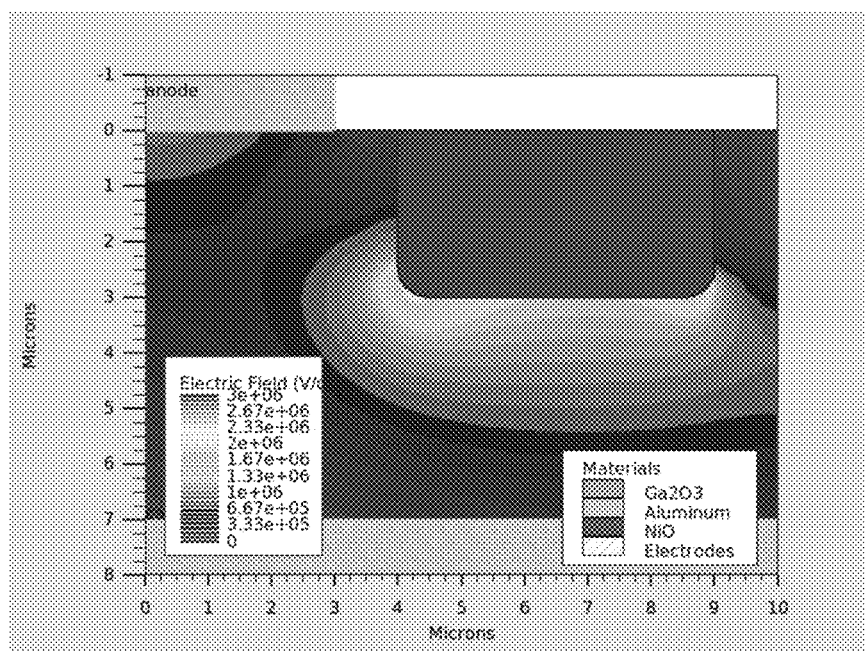
FIG. 9 is a view illustrating the simulation result of Example 1.

FIG. 9 is a view illustrating the simulation result of Example 1. Also in the simulation model of Example 1, an electric field concentrated on the corner of the anode electrode 40; however, the electric field was dispersed by the outer peripheral trench 10 and the depletion layer extending around the outer peripheral trench 10, with the result that the maximum value thereof was reduced to 0.4 MV/cm.

Example 2

A simulation model of Example 2 having the same configuration as that of the Schottky barrier diode 200 illustrated in FIG. 3 was assumed, and electric field strength was simulated with a backward voltage applied between the anode electrode 40 and the cathode electrode 50. The depth D1 and width W3 of the center trench 60 were set to 3 μm and 1 μm, respectively, the mesa width W1 of the mesa region M1 was set to 2 μm, and the insulating film 61 formed on the inner wall of the center trench 60 was an HfO$_2$ film having a thickness of 50 nm. On the other hand, the depth D2 and width W4 of the outer peripheral trench 10 were set to 3 μm and 2 μm, respectively, and the mesa width W2 of the mesa region M2 was set to 2 μm. The dopant concentration of the semiconductor substrate 20 was set to $1 \times 10^{18}$ cm$^{-3}$. The dopant concentration of the drift layer 30 was set to $5 \times 10^{16}$ cm$^{-3}$. The thickness of the drift layer 30 was set to 7 μm. Other conditions are the same as those for the simulation model of Example 1.

For comparison, a simulation model of Comparative Example 2 having a structure obtained by removing the outer peripheral trench 10 and semiconductor material 11 from the simulation model of Example 2 was assumed, and electric field strength was simulated with a backward voltage applied between the anode electrode 40 and the cathode electrode 50.

Figure 10:
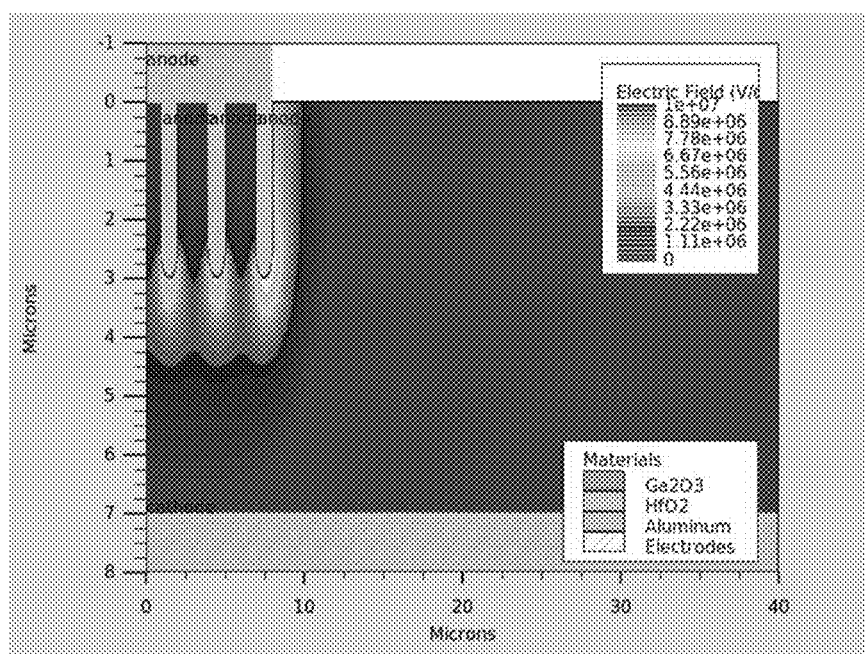
FIG. 10 is a view illustrating the simulation result of Comparative Example 2.

FIG. 10 is a view illustrating the simulation result of Comparative Example 2. In the simulation model of Comparative Example 2, an electric field concentrated on the bottom portion of the center trench 60a positioned at the end portion, and the maximum value thereof was 8.4 MV/cm.

Figure 11:
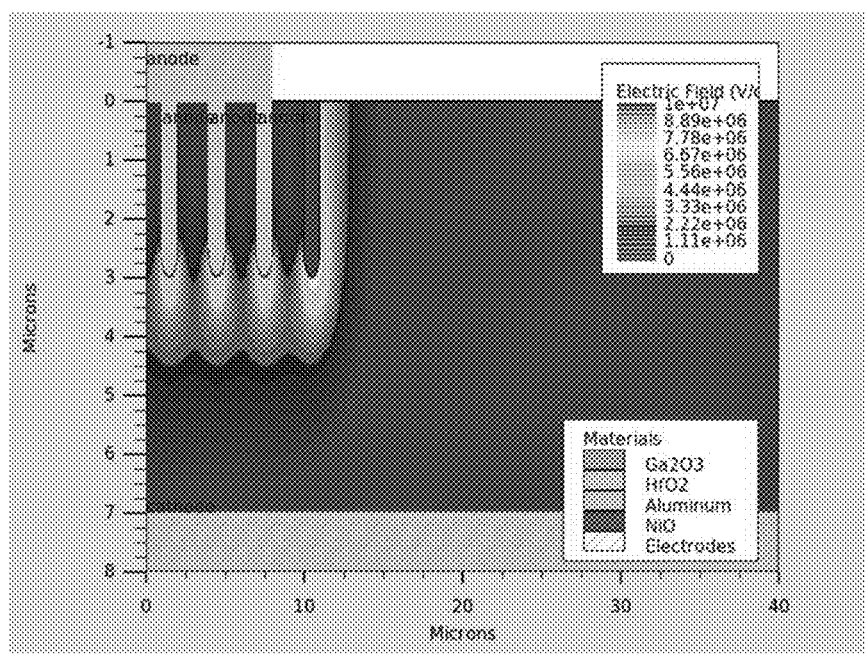
FIG. 11 is a view illustrating the simulation result of Example 2.

FIG. 11 is a view illustrating the simulation result of Example 2. Also in the simulation model of Example 2, an electric field concentrated on the bottom portion of the center trench 60a positioned at the end portion; however, the electric field was dispersed by the outer peripheral trench 10 and the depletion layer extending around the outer peripheral trench 10, with the result that the maximum value thereof was reduced to 6.8 MV/cm.

Figure 4:
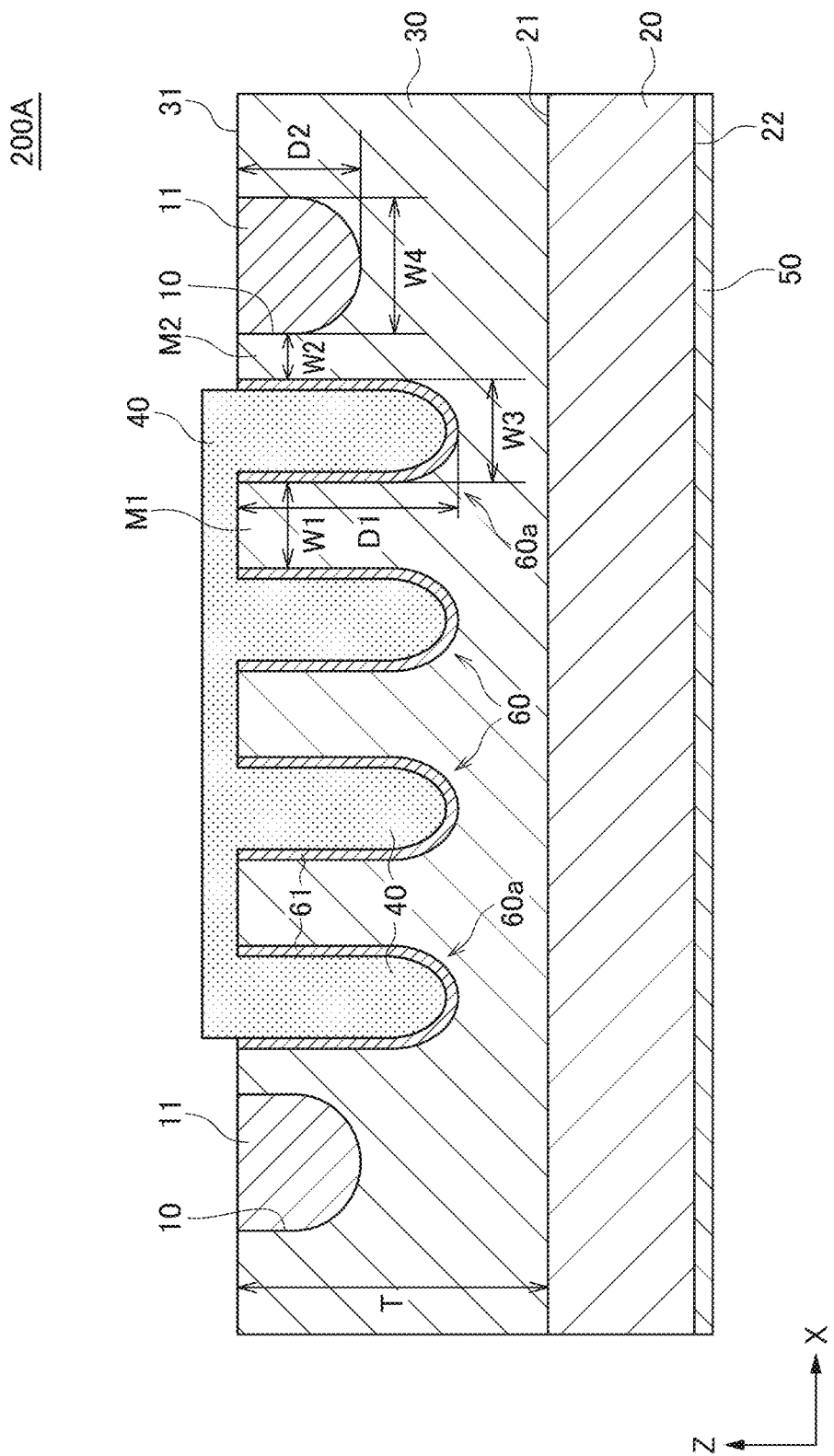
FIG. 4 is a schematic cross-sectional view illustrating the configuration of a Schottky barrier diode 200A according to a first modification of the second embodiment of the present invention.
Figure 5:
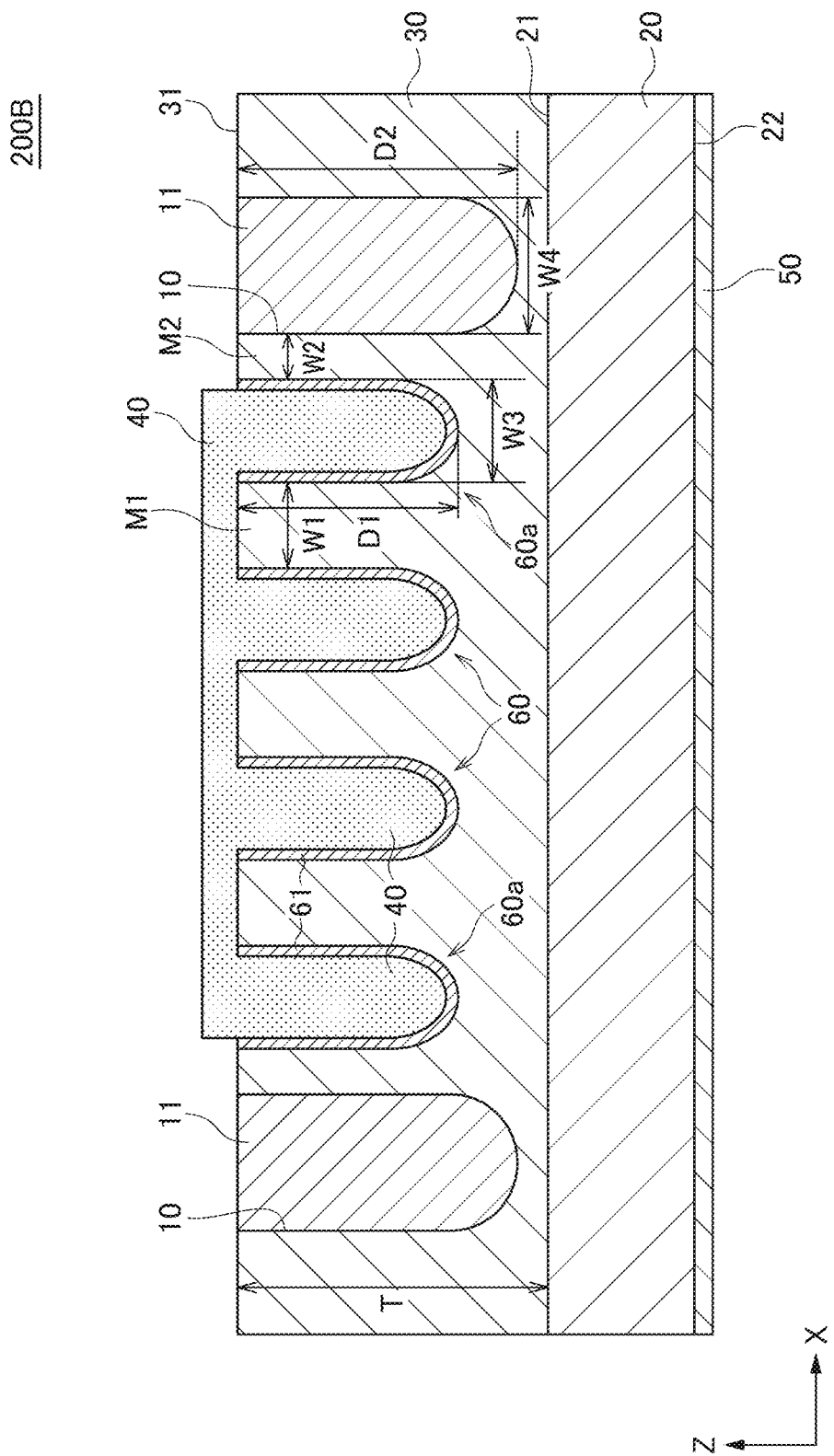
FIG. 5 is a schematic cross-sectional view illustrating the configuration of a Schottky barrier diode 200B according to a second modification of the second embodiment of the present invention.

Next, a simulation model of Example 2A having the same configuration as that of the Schottky barrier diode 200A illustrated in FIG. 4 and a simulation model of Example 2B having the same configuration as that of the Schottky barrier diode 200B illustrated in FIG. 5 were assumed, and electric field strength was simulated with a backward voltage applied between the anode electrode 40 and the cathode electrode 50. The conditions for Example 2A were the same as those for Example 2 except that the depth D2 of the outer peripheral trench 10 was 1 μm. The conditions for Example 2B were the same as those for Example 2 except that the depth D2 of the outer peripheral trench 10 was 5 μm.

Figure 12:
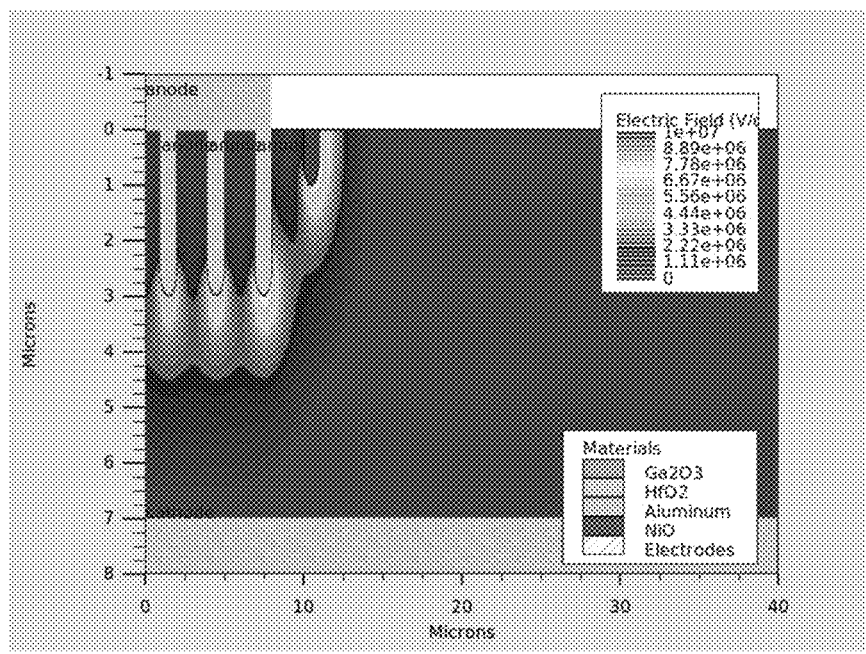
FIG. 12 is a view illustrating the simulation result of Example 2A.
Figure 13:
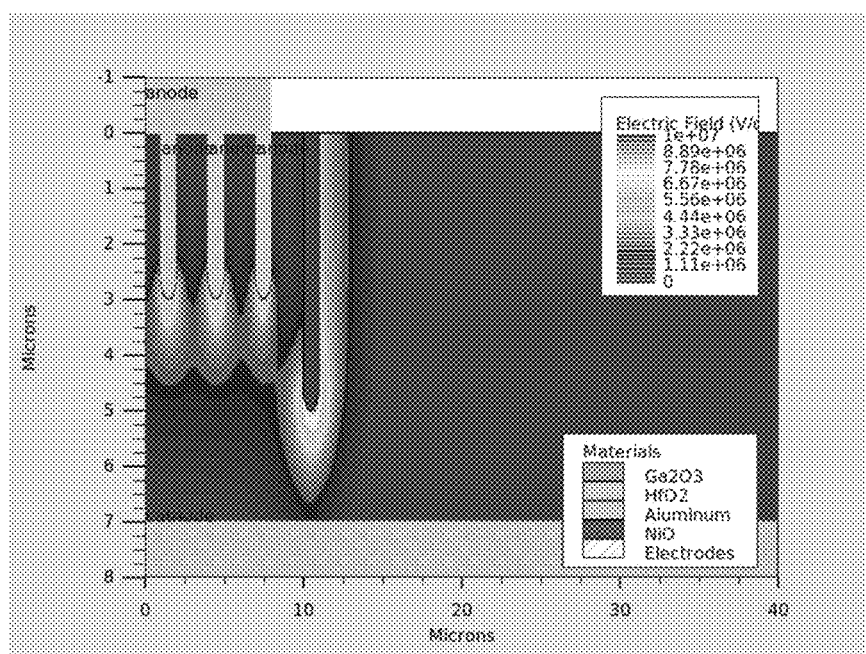
FIG. 13 is a view illustrating the simulation result of Example 2B.

FIGS. 12 and 13 are views illustrating the simulation results of Examples 2A and 2B. In the simulation models of Examples 2A and 2B, the maximum values of the electric field concentrating on the center trench 60a positioned at the end portion were 8.0 V/cm and 5.8 V/cm, respectively. This revealed that the larger the depth D2 of the outer peripheral trench 10, the more the electric field concentrating on the center trench 60a at the end portion was alleviated.

Further, simulation models of Examples 2C-1 and 2C-2 each provided with a plurality of the outer peripheral trenches 10 like the Schottky barrier diode 200C illustrated in FIG. 6 were assumed, and electric field strength was simulated with a backward voltage applied between the anode electrode 40 and the cathode electrode 50. The conditions for Example 2C-1 were the same as those for Example 2 except that three outer peripheral trenches 10 were formed. The conditions for Example 2C-2 were the same as those for Example 2 except that five outer peripheral trenches 10 were formed.

Figure 14:
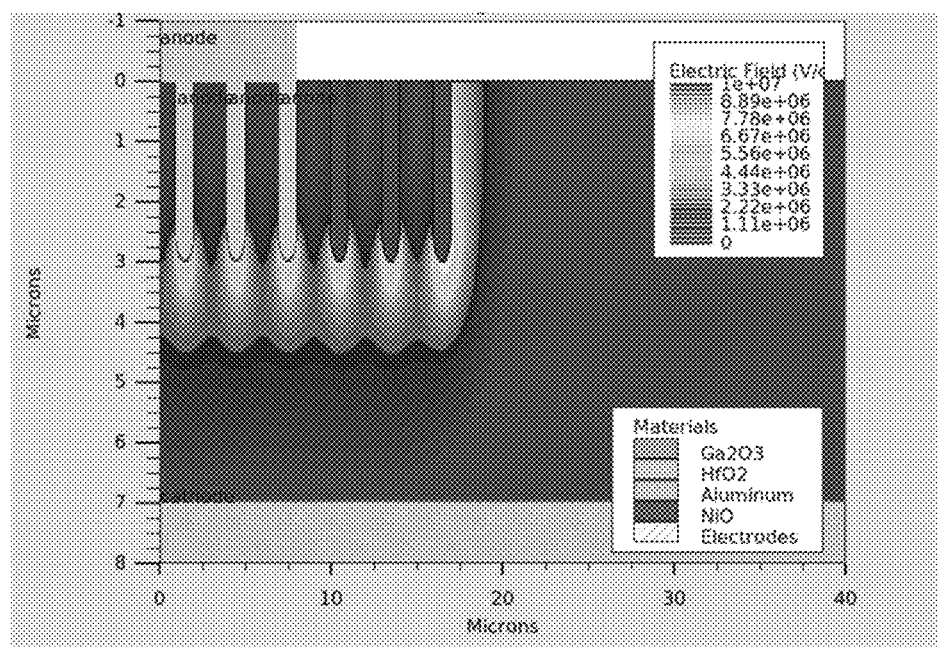
FIG. 14 is a view illustrating the simulation result of Example 2C-1.
Figure 15:
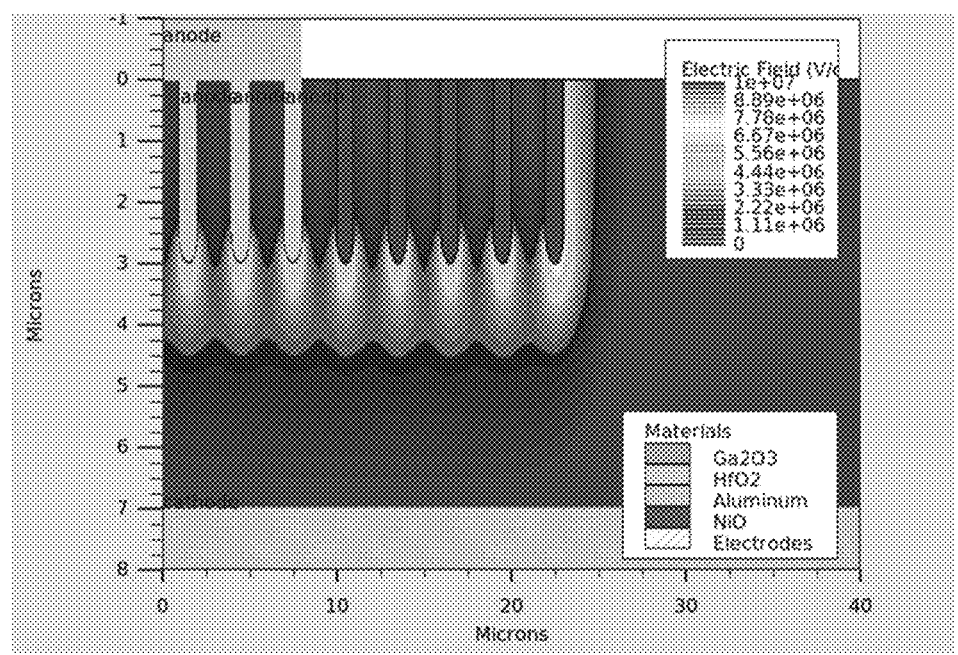
FIG. 15 is a view illustrating the simulation result of Example 2C-2.

FIGS. 14 and 15 are views illustrating the simulation results of Examples 2C-1 and 2C-2. As illustrated, in this case, it was found that an electric field concentrated on the outermost outer peripheral trench 10.

Example 3

A simulation model of Example 3 having the same configuration as that of the Schottky barrier diode 300 illustrated in FIG. 7 was assumed, and electric field strength was simulated with a backward voltage applied between the anode electrode and the cathode electrode. The width W4 of the outer peripheral trench 10 was set to 10 μm, and the mesa width W2 of the mesa region M2 was to 2 μm. The insulating layer 70 was silicon oxide having a thickness of 300 nm, and the field plate length thereof was set to 10 μm. Other conditions are the same as those of the simulation model of Example 2.

For comparison, a simulation model of Comparative Example 3 having a structure obtained by removing the outer peripheral trench 10 and semiconductor material 11 from the simulation model of Example 3 was assumed, and electric field strength was simulated with a backward voltage applied between the anode electrode 40 and the cathode electrode 50.

Figure 16:
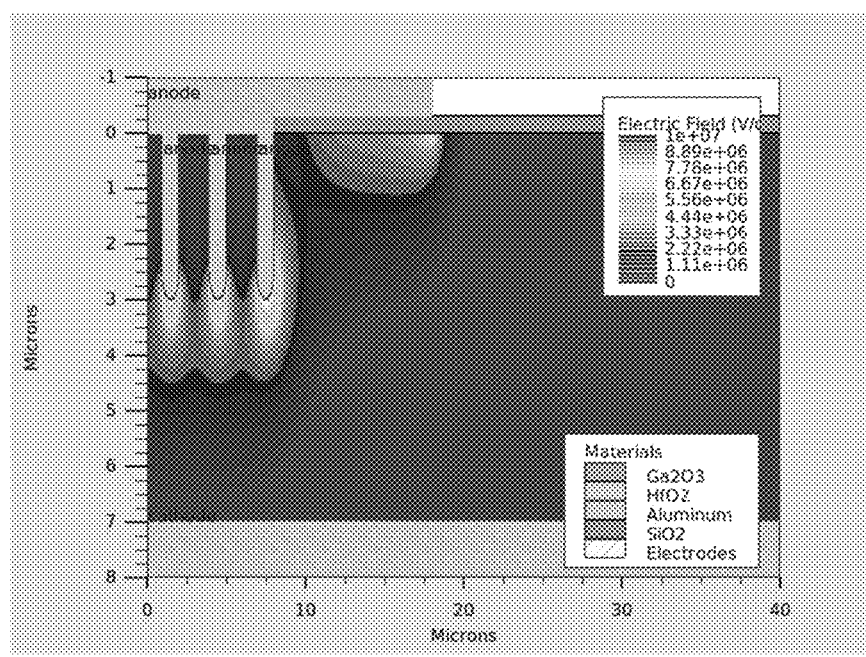
FIG. 16 is a view illustrating the simulation result of Comparative Example 3.

FIG. 16 is a view illustrating the simulation result of Comparative Example 3. In the simulation model of Comparative Example 3, an electric field concentrated on the bottom portion of the center trench 60a positioned at the end portion, and the maximum value thereof was 8.1 MV/cm.

Figure 17:
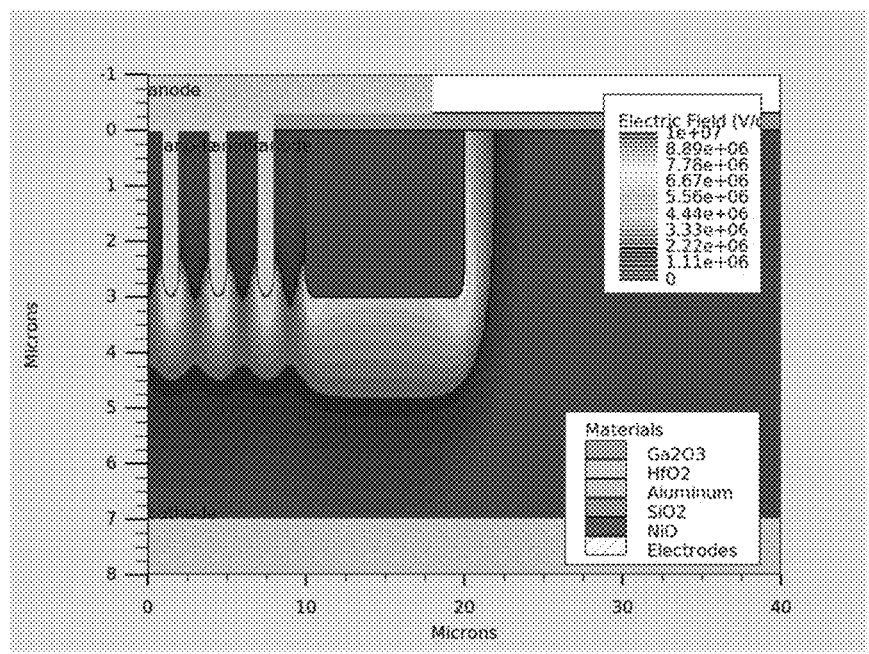
FIG. 17 is a view illustrating the simulation result of Example 3.

FIG. 17 is a view illustrating the simulation result of Example 3. Also in the simulation model of Example 3, an electric field concentrated on the bottom portion of the center trench 60a positioned at the end portion; however, the electric field was dispersed by the outer peripheral trench 10 and the depletion layer extending around the outer peripheral trench 10, with the result that the maximum value thereof was reduced to 6.8 MV/cm.

Figure 18:
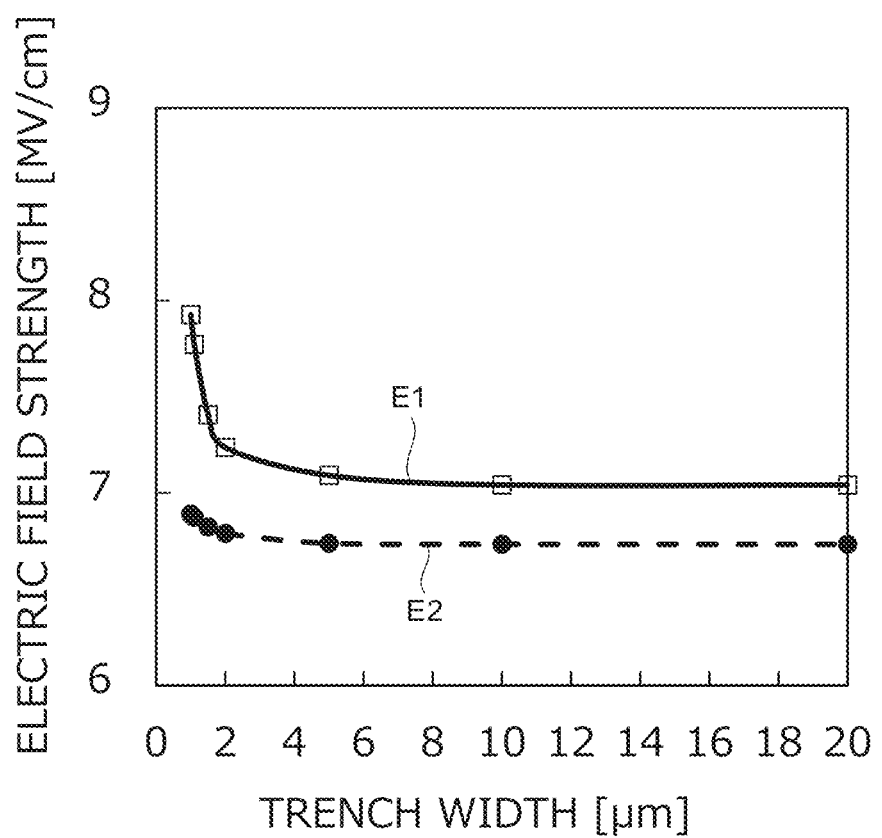
FIG. 18 is a graph illustrating the relationship between the width W4 of the outer peripheral trench 10 and the electric field strength.

FIG. 18 is a graph illustrating the relationship between the width W4 of the outer peripheral trench 10 and the electric field strength. In FIG. 18, E2 denotes the maximum electric field applied to the drift layer 30 near the center trench 60a located at the end portion, and E1 denotes the maximum electric field applied to the drift layer 30 near the outer peripheral trench 10.

As illustrated in the graph of FIG. 18, the electric field applied to the drift layer 30 near the outer peripheral trench 10 was alleviated more as the width W4 of the outer peripheral trench 10 is greater. That is, it is found as follows: in the region where the width W4 of the outer peripheral trench 10 is less than 2 μm, alleviation effect of electric field strength obtained by increasing the width W4 is remarkable; in the region where the width W4 becomes equal to or more than 2 μm, alleviation effect of electric field strength obtained by increasing the width W4 becomes low; and in the region where the width W4 reaches about 5 μm, alleviation effect of electric field strength obtained by increasing the width W4 is substantially saturated. Considering this, the width W4 of the outer peripheral trench 10 is preferably 2 μm or more and more preferably 5 μm or more. On the other hand, the electric field applied to the drift layer 30 near the center trench 60a positioned at the end portion was constant regardless of the width W4 of the outer peripheral trench 10.

REFERENCE SIGNS LIST 10 outer peripheral trench
11 semiconductor material
20 semiconductor substrate
21 upper surface of semiconductor substrate
22 back surface of semiconductor substrate
30 drift layer
31 upper surface of the drift layer
40 anode electrode
50 cathode electrode
60 center trench
60a center trench positioned at end portion
61 insulating film
70 insulating layer
71 opening
100, 200, 300 Schottky barrier diode
M1, M2 mesa region

What is claimed is:
1. A Schottky barrier diode comprising:
a semiconductor substrate made of gallium oxide;
a drift layer made of gallium oxide and provided on the semiconductor substrate;
an anode electrode that is in Schottky contact with the drift layer; and
a cathode electrode that is in ohmic contact with the semiconductor substrate,
wherein the drift layer has an outer peripheral trench that surrounds the anode electrode in a plan view and a plurality of center trenches formed at a position overlapping the anode electrode in a plan view,
wherein each of the plurality of center trenches is filled with a conductive material,
wherein an inner wall of each of the plurality of center trenches is covered with an insulating film in order for the conductive material not to be in contact with the drift layer,
wherein the outer peripheral trench is filled with a semiconductor material having a conductivity type opposite to that of the drift layer, and
wherein an inner wall of the outer peripheral trench is not covered with an insulating film such that side and bottom surfaces of the outer peripheral trench are entirely in contact with the semiconductor material.
2. The Schottky barrier diode as claimed in claim 1, further comprising an insulating layer formed on the drift layer and having an opening through which a part of the drift layer is exposed, wherein the anode electrode is in Schottky contact with the drift layer through the opening and located on the insulating layer positioned at a periphery of the opening.

3. The Schottky barrier diode as claimed in claim 1, wherein a width of the outer peripheral trench is larger than a width of the center trench.

4. The Schottky barrier diode as claimed in claim 1, wherein a mesa width between the outer peripheral trench and center trench positioned closest to the outer peripheral trench is smaller than a mesa width between the plurality of center trenches.

5. The Schottky barrier diode as claimed in claim 1, wherein the semiconductor material having an opposite conductivity type is an oxide semiconductor.

6. The Schottky barrier diode as claimed in claim 1, wherein the outer peripheral trench is different in depth from each of the plurality of center trenches.

7. The Schottky barrier diode as claimed in claim 6, wherein the outer peripheral trench is smaller in depth than each of the plurality of center trenches.

8. The Schottky barrier diode as claimed in claim 1, wherein the bottom surface of the outer peripheral trench is curved.

9. The Schottky barrier diode as claimed in claim 1, wherein the semiconductor material is different from the conductive material.

10. The Schottky barrier diode as claimed in claim 9, wherein the conductive material is the same material as the anode electrode.

11. The Schottky barrier diode as claimed in claim 1, wherein the outer peripheral trench is not covered by the anode electrode.

12. A Schottky barrier diode comprising:
    a semiconductor substrate made of gallium oxide;
    a drift layer made of gallium oxide and provided on the semiconductor substrate;
    an anode electrode that is in Schottky contact with the drift layer; and
    a cathode electrode that is in ohmic contact with the semiconductor substrate,
    wherein the drift layer has an outer peripheral trench that surrounds the anode electrode in a plan view and a plurality of center trenches formed at a position overlapping the anode electrode in a plan view,
    wherein each of the plurality of center trenches is filled with a first conductive material,
    wherein the outer peripheral trench is filled with a second conductive material different from the first conductive material, and
    wherein the second conductive material having a conductivity type opposite to that of the drift layer.

13. The Schottky barrier diode as claimed in claim 12, wherein the first conductive material contacts with neither the semiconductor substrate nor the drift layer.

14. The Schottky barrier diode as claimed in claim 12, wherein the outer peripheral trench is not covered by the anode electrode.

* * * * *